(12) United States Patent
Stecher

(10) Patent No.: US 7,732,848 B2
(45) Date of Patent: Jun. 8, 2010

(54) POWER SEMICONDUCTOR DEVICE WITH IMPROVED HEAT DISSIPATION

(75) Inventor: Matthias Stecher, Müchen (DE)

(73) Assignee: Infineon Technologies AG, Neubiberg (DE)

( * ) Notice: Subject to any disclaimer, the term of this patent is extended or adjusted under 35 U.S.C. 154(b) by 117 days.

(21) Appl. No.: 11/756,389

(22) Filed: May 31, 2007

(65) Prior Publication Data

US 2008/0296773 A1 Dec. 4, 2008

(51) Int. Cl.
*H01L 23/62* (2006.01)
*H01L 21/336* (2006.01)

(52) U.S. Cl. ............... 257/302; 257/330; 257/331; 257/332; 257/343; 438/259; 438/272

(58) Field of Classification Search ............. 257/302, 257/331, 330, 332, 342, 343, 346; 438/259, 438/270, 271, 272
See application file for complete search history.

(56) References Cited

U.S. PATENT DOCUMENTS

| | | | |
|---|---|---|---|
| 5,204,541 A * | 4/1993 | Smayling et al. ............. 257/138 |
| 5,455,462 A | 10/1995 | Marrs et al. | |
| 5,625,226 A | 4/1997 | Kinzer | |
| 5,726,481 A | 3/1998 | Moody | |
| 6,072,215 A * | 6/2000 | Kawaji et al. ............. 257/334 |
| 6,150,722 A | 11/2000 | Effland et al. | |
| 6,518,126 B2 * | 2/2003 | Yang et al. ............. 438/259 |
| 6,600,194 B2 * | 7/2003 | Hueting et al. ............. 257/331 |
| 2002/0019099 A1 * | 2/2002 | Williams et al. ............. 438/270 |
| 2005/0127534 A1 | 6/2005 | Stecher et al. | |
| 2005/0269624 A1 * | 12/2005 | Hu et al. ............. 257/315 |
| 2006/0001084 A1 | 1/2006 | Kelly | |
| 2007/0267749 A1 | 11/2007 | Stecher et al. | |

* cited by examiner

*Primary Examiner*—Wael Fahmy
*Assistant Examiner*—Steven H Rao
(74) *Attorney, Agent, or Firm*—Schwegman Lundberg & Woessner, P.A.

(57) ABSTRACT

A semiconductor device is disclosed that improves heat dissipation by providing blind contact elements on a dielectric layer. Embodiments are disclosed which include a substrate having at least one electrode contact area accessible at a surface of the substrate and a surface adjacent the electrode contact area, a dielectric layer disposed above the surface; an intermediate oxide layer disposed above the dielectric layer, a current conducting metallization layer disposed above the intermediate oxide layer; and at least one contact element vertically extending from the dielectric layer through the intermediate oxide layer to the metallization layer above the surface adjacent the electrode contact area, the at least one contact element having a heat conductivity that is higher than that of the intermediate oxide layer.

21 Claims, 1 Drawing Sheet

POWER SEMICONDUCTOR DEVICE WITH IMPROVED HEAT DISSIPATION

TECHNICAL FIELD

The present invention relates to a semiconductor device and a method of manufacturing a semiconductor device such as a power semiconductor device.

BACKGROUND

In the field of semiconductor devices and power semiconductor devices, and IC (Integrated Circuit) devices such as BCD devices (BCD: Bipolar-CMOS-DMOS), IGBTs and the like, one or more metallization layers are used to conduct large currents (high power currents).

Because more and more heat is being generated in recently-developed power semiconductor devices, there is a need for improved heat dissipation via the side of the semiconductor substrate on which the circuit structure is formed.

DETAILED DESCRIPTION

Figure 1:
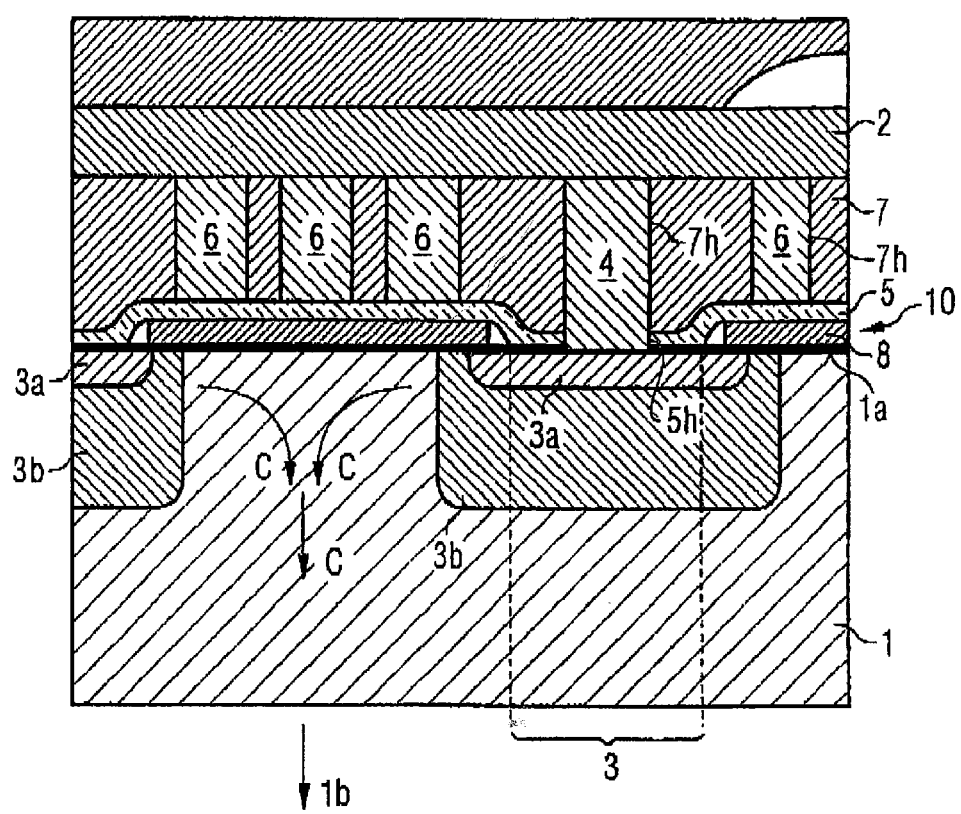
FIG. 1 shows a cross-sectional view of a REM scan of a vertical power DMOS implementing an embodiment of the present teachings.

FIG. 1 shows a cross-sectional view of a REM scan of a cut through a portion of an embodiment of a vertical power DMOS according to the present invention. The embodiment shown comprises a substrate 1 (e.g. Si-substrate) having a first surface 1a.

The view in FIG. 1 shows a cross-section through a source region of the vertical power DMOS embodiment. In such a source region, p-wells 3b are formed at equal intervals in the substrate 1 along the first surface 1a. In the p-wells 3b, $n^+$ source contact areas 3 are formed. In some embodiments, an oxide layer (not shown) is formed as a gate oxide layer above the first surface 1a. In some embodiments, a DMOS gate structure 8 is formed above the gate oxide layer, thereby leaving source electrode contact areas 3 above the source contact regions 3a uncovered.

A dielectric layer 5 is formed above the source electrode contact areas 3 and above the gate structures 8. The source electrode contact areas 8 may have been partly covered by the gate oxide layer, but in some embodiments, the gate oxide layer is removed.

In the dielectric layer 5, through holes 5h are formed, thereby partly exposing the electrode contact areas 3 through the dielectric layer 5. On the dielectric layer 5, an intermediate oxide layer 7, e.g. of BPSG, is formed. In the intermediate oxide layer 7, through holes 7h are formed. In particular, through holes 7h are formed at first positions above the positions of the through holes 5h in the dielectric layer 5 and at second positions adjacent to the first positions. The through holes 7h in the intermediate layer 7 at the first positions combine with the through holes 5h in the dielectric layer 5 to form continuous through holes through the intermediate oxide layer 7 and the dielectric layer 5, hereinafter referred to as "electrode contact through holes". On the other hand, the through holes 7h at the second positions terminate at the dielectric layer 5.

In some embodiments, the electrode contact through holes and the through holes 7h at the first positions are filled with contact elements 4, 6 of tungsten (W) or mainly of W or tungsten alloys. In some embodiments, the contact elements 4, 6 are made completely or mainly of aluminum (Al), copper (Cu), WTi or any other metal or metal alloy having appropriate heat and current conductivity characteristics for the use as current and/or heat conducting plugs and have compatible deposition characteristics for the required aspect ratio of the through holes, such as e.g. a combination of a Ta/TaN layer on the contact area below a Cu plug forming together a contact element 4, 6. On the intermediate oxide layer 7, a power current conductivity metallization layer 2 preferably made of aluminium (Al) or copper (Cu) is formed so as to contact the contact elements 4, 6.

The dielectric layer 5 is made of a material, preferably silicon carbide (SiC), having a relatively high heat conductivity in comparison to the heat conductivity of silicon dioxide. SiC has a heat conductivity in the range of about 14 to more than about 200 W/(mK), depending on the type of SiC and its method of manufacturing. In some embodiments, polycrystalline SiC is used. In some embodiments, polycrystalline diamond or $Al_2O_3$ are used as materials for the dielectric layer 5. In some embodiments, the gate oxide layer is completely removed across the entire electrode contact area 3. However, in embodiments where the gate oxide layer partly remains, it is so thin that it does not represent a significant resistance to heat dissipation. The dielectric layer 5, having a high heat conductivity, contacts the electrode contact area 3 at all locations where the electrode contact element 4 is not in contact with the electrode contact area 3. Accordingly, the surface area through which heat can be dissipated is significantly enlarged.

The dielectric layer 5 dissipates the heat towards the blind contact elements 6 which are in through holes 7h at second positions adjacent the first position, and which in turn, dissipate the heat towards the power current conducting metallization layer 2. A blind contact element is one having an end which is not electrically connected to electronic circuitry. In other words blind contact element 6 is electrically connected only to metallization layer 2.

In a vertical power DMOS of the type shown in FIG. 1, the substrate regions where the heat is mostly generated are located where relatively large currents flow. The large currents are schematically shown by current arrows C.

Accordingly, it is clear from FIG. 1 that the provision of the blind contact elements 6 significantly improves the heat dissipation, in particular in combination with the dielectric layer 5 that also has a high heat conductivity.

The provision of the blind contact elements 6 adjacent to the electrode contact elements 4 and/or in the area above the region of the substrate where the most heat is generated, preferably in combination with a dielectric layer 5 having a high heat connectivity, and formed in contact with the blind contact elements 6, significantly improves the heat dissipation in power semiconductor devices.

The present teachings can be applied not only to vertical power DMOS embodiments, but also to lateral power DMOS, power-npn and power-pnp transistor embodiments and IGBT embodiments. Further, it is also possible to apply the present teachings to embodiments of logic-CMOS devices.

A representative method of manufacturing a power semiconductor device of the type shown in FIG. 1 will be briefly described. In manufacturing power semiconductor devices such as vertical power DMOS embodiments, the $p^+$ and $n^+$ contact implantations (dopings) are usually the last operations performed before the first surface 1a of the semiconductor substrate is completely covered/sealed by layers of the multilayer structure formed on top of the first surface 1a.

Therefore, in some embodiments, the dielectric layer 5 formed of SiC is deposited as the process before the implantation (doping) for the contact implantations. The reason is that SiC is difficult to structure and difficult to make planar. In addition, SiC can only be etched isotropically and the plasma etching rates are rather low. Therefore, in some embodiments, before depositing the dielectric layer 5 of SiC, all forming of the implanted regions, except for the $n^+$ and $p^+$ contact implantations, and the forming of the gate structures and so on are performed.

Thereafter, the SiC layer forming the dielectric layer 5 is deposited. A wet etching step is subsequently performed in some embodiments to open contact holes (through holes) 5h in the dielectric layer 5. Thereafter, $n^+$ and $p^+$ contact implantations (dopings) and the corresponding healing steps are performed and then an intermediate oxide layer 7 of BPSG is deposited and planarized. Through holes 7h are then formed by plasma etching at first positions above the through holes 5h in the dielectric layer 5 and at second positions adjacent to the first positions. At the first positions, as in the above-mentioned known technology, the plasma etching stops upon reaching the Si at the first surface 1a.

Thereafter, W is deposited to form electrode contact elements 4 and blind contact elements 6 by filling in the through holes 5h, 7h with W. Finally, a power current conductivity metallization layer 2 is deposited and structured. Any remaining steps for manufacturing the corresponding power semiconductor device, such as passivation steps, sealing steps, contacting steps, and so on, may then be performed, as necessary.

CONCLUSION

The present teachings provide, in one aspect, a power semiconductor device in which the heat dissipation capability is significantly improved by providing blind contact elements made of a material having a high heat conductivity formed adjacent to the electrode contact elements and in contact with the power current conducting metallization layer. The blind contact elements assist in dissipating heat from the semiconductor substrate surface into the power current conducting metallization layer.

The present teachings provide, in another aspect, a power semiconductor device comprising a dielectric layer having a heat conductivity significantly higher than the heat conductivity of silicon dioxide, and preferably having a heat conductivity of at least the value of the semiconductor substrate material. Blind contact elements are formed adjacent to the electrode contact elements and in contact with the dielectric layer and a power current conducting metallization layer, thus significantly improving the heat dissipation from the semiconductor substrate surface.

Further advantages and details will become apparent from the detailed description of the preferred embodiment when read referring to the drawings.

The invention claimed is:

1. Apparatus comprising:
a substrate having at least one electrode contact area accessible at a surface of the substrate and a surface region adjacent the electrode contact area;
a dielectric layer disposed above the surface region;
an intermediate oxide layer disposed above the dielectric layer;
a current conducting metallization layer disposed above the intermediate oxide layer; and
at least one blind contact element vertically extending from the dielectric layer through the intermediate oxide layer to the metallization layer above the surface region and physically contacting the metallization layer, the at least one blind contact element having a heat conductivity that is higher than that of the intermediate oxide layer.

2. The apparatus of claim 1, wherein at least one of the at least one contact elements is positioned above and electrically insulated from the surface region.

3. The apparatus of claim 1, wherein the thermal conductivity of the dielectric layer is equal to or larger than about 20 W/(mK).

4. A power semiconductor device, comprising:
a semiconductor substrate having a first surface including an electrode contact area,
a multi-layer circuitry structure formed above the first surface of the semiconductor substrate and including a power current conducting metallization layer,
an electrode contact element formed of a first material having a relatively high electrical conductivity, the electrode contact element being in contact with at least a part of the electrode contact area of the first surface and being in contact with the power current conducting metallization layer,
a dielectric layer formed of a second material having a heat conductivity of at least 10 W/(mK), and
at least one blind contact element formed of the first material and in contact with the dielectric layer and in physical contact with the power current conducting metallization layer.

5. The power semiconductor device according to claim 4, wherein the second material has a heat conductivity equal to or larger than 20 W/(mK), preferably equal to or higher than 100 W/(mK).

6. The power semiconductor device according to claim 4, wherein the second material is SiC, $Al_2O_3$ or polycrystalline diamond.

7. A power semiconductor device, comprising:
a semiconductor substrate having a first surface including an electrode contact area,
a multi-layer circuitry structure formed on the first surface of the semiconductor substrate and including a power current conducting metallization layer,
an electrode contact element formed of a first material having a relatively high electrical conductivity, the electrode contact element being in contact with at least a part of the electrode contact area at the first surface and in contact with the power current conducting metallization layer,
a dielectric layer formed of a second material, and
at least one blind contact element formed of a third material which has a relatively high heat conductivity and is in contact with the dielectric layer and in physical contact with the power current conducting metallization layer adjacent to the electrode contact element.

8. The power semiconductor device according to claim 7, wherein the second material has a heat conductivity of at least 10 W/(mK).

9. The power semiconductor device according to claim 7, wherein the second material has a heat conductivity equal to or larger than 20 W/(mK), preferably equal to or higher than 100 W/(mK).

10. The power semiconductor device according to claim 7, wherein the second material is SiC, $Al_2O_3$ or polycrystalline diamond.

11. The power semiconductor device according to claim 10, wherein the third material is the same material as the first material and is mainly composed of W.

12. The power semiconductor device according to claim 11, wherein the power current conducting metallization layer is mainly composed of Cu or Al.

13. The power semiconductor device according to claim 7, wherein the third material is the same material as the first material and is mainly comprised of W.

14. A method of manufacturing a power semiconductor device, comprising:
- forming, on or above a semiconductor substrate having a first surface and comprising a gate structure and regions of different conductivity types for the power semiconductor device, a dielectric layer from a material having a heat conductivity of at least 10 W/(mK);
- etching through holes in the dielectric layer at positions that expose surface areas for electrode contact regions to be later implanted;
- forming electrode contact regions by implanting impurities into the semiconductor substrate via the through holes in the dielectric layer;
- forming an intermediate oxide layer on or above the dielectric layer;
- etching through holes in the intermediate oxide layer at first positions that correspond to the positions of the through holes in the dielectric layer, and at second positions adjacent to the first positions;
- forming contact elements from a material having a relatively high electrical conductivity and a relatively high heat conductivity mainly composed of W, in the through holes in the intermediate oxide layer; and
- forming a power current conducting metallization layer mainly composed of Cu or Al, and in physical contact with the contact elements.

15. A method according to claim 14, wherein the dielectric layer is made of SiC, $Al_2O_3$ or polycrystalline diamond.

16. A method according to claim 14, wherein the contact elements are formed of a material mainly composed of W.

17. A power semiconductor device comprising:
- a semiconductor substrate having a plurality of discrete doped wells disposed therein and an intervening surface between the respective discrete doped wells,
- a dielectric layer disposed above the semiconductor substrate,
- an intermediate oxide layer disposed above the dielectric layer,
- a power current conducting metallization layer disposed above the intermediate oxide layer, and
- at least one blind contact element vertically extending from the dielectric layer through the intermediate oxide layer to the power current conducting metallization layer and physically contacting the metallization layer, wherein the at least one blind contact element is located above the intervening surface between the respective doped wells, substantially comprises tungsten and has a heat conductivity that is significantly higher than the intermediate oxide layer.

18. The power semiconductor device according to claim 17, wherein the dielectric layer at least substantially comprises a second material having a heat conductivity of at least 10 W/(mK).

19. The power semiconductor device according to claim 18, wherein the second material has a heat conductivity equal to or larger than 20 W/(mK), preferably equal to or higher than 100 W/(mK).

20. The power semiconductor device according to claim 19, wherein the second material is selected from the group consisting of SiC, $Al_2O_3$ and polycrystalline diamond.

21. The apparatus of claim 1, wherein said at least one blind contact element is electrically connected only to the metallization layer.

* * * * *